United States Patent
Jenkins et al.

(10) Patent No.: US 10,230,361 B2
(45) Date of Patent: Mar. 12, 2019

(54) HIGH-SPEED CLOCKED COMPARATORS

(71) Applicant: Perceptia Devices Australia Pty Ltd, Scotts Valley, CA (US)

(72) Inventors: Julian Jenkins, Kurraba Point (AU); Timothy Robins, Santa Cruz, CA (US)

( * ) Notice: Subject to any disclaimer, the term of this patent is extended or adjusted under 35 U.S.C. 154(b) by 152 days.

(21) Appl. No.: 15/243,616

(22) Filed: Aug. 22, 2016

(65) Prior Publication Data
US 2017/0063361 A1    Mar. 2, 2017

Related U.S. Application Data

(60) Provisional application No. 62/211,186, filed on Aug. 28, 2015.

(51) Int. Cl.
H03K 5/153 (2006.01)
H03K 5/24 (2006.01)

(52) U.S. Cl.
CPC .......... *H03K 5/249* (2013.01); *H03K 5/2481* (2013.01)

(58) Field of Classification Search
CPC ............................ H03K 5/249; H03K 5/2481
USPC ........................................................ 327/52
See application file for complete search history.

(56) References Cited

U.S. PATENT DOCUMENTS

| | | | | |
|---|---|---|---|---|
| 5,162,681 A * | 11/1992 | Lee | .......................... | G11C 7/062 327/53 |
| 6,448,822 B1 * | 9/2002 | Dadashev | .......... | H03K 3/02337 327/65 |
| 7,233,172 B2 * | 6/2007 | Kanamori | .............. | G11C 7/065 327/55 |
| 8,829,942 B2 * | 9/2014 | Chan | ......................... | H03K 5/22 327/65 |
| 2007/0290708 A1 * | 12/2007 | Takatori | ............... | G01R 31/319 324/750.3 |
| 2011/0215959 A1 * | 9/2011 | Matsuzawa | .......... | H03K 5/2481 341/160 |
| 2013/0257483 A1 * | 10/2013 | Bulzacchelli | .......... | H03K 3/012 327/53 |
| 2013/0265817 A1 * | 10/2013 | Christian | ................ | G11C 11/24 365/149 |
| 2014/0253359 A1 * | 9/2014 | Niwa | ................... | H03M 1/1023 341/172 |
| 2017/0047910 A1 * | 2/2017 | Thelen, Jr. | ........... | H03K 5/2481 |
| 2018/0091166 A1 * | 3/2018 | Lye | ......................... | H03K 5/249 |

* cited by examiner

*Primary Examiner* — Ryan Jager
(74) *Attorney, Agent, or Firm* — André Henri Grouwstra

(57) ABSTRACT

A comparator circuit has a sense amplifier with a differential pair, a voltage excursion limiter, and a switch. The differential pair receives two analog input signals. Its differential outputs operate at a common mode voltage approximately half the supply voltage. The voltage limiter is coupled with one of the differential pair outputs. A capacitor may store comparison results. The switch energizes the differential pair and the voltage excursion limiter during a first phase of a clock, and de-energizes them during a second phase of the clock. During this phase, the comparator may provide the stored comparison result to an amplifier with positive feedback.

18 Claims, 15 Drawing Sheets

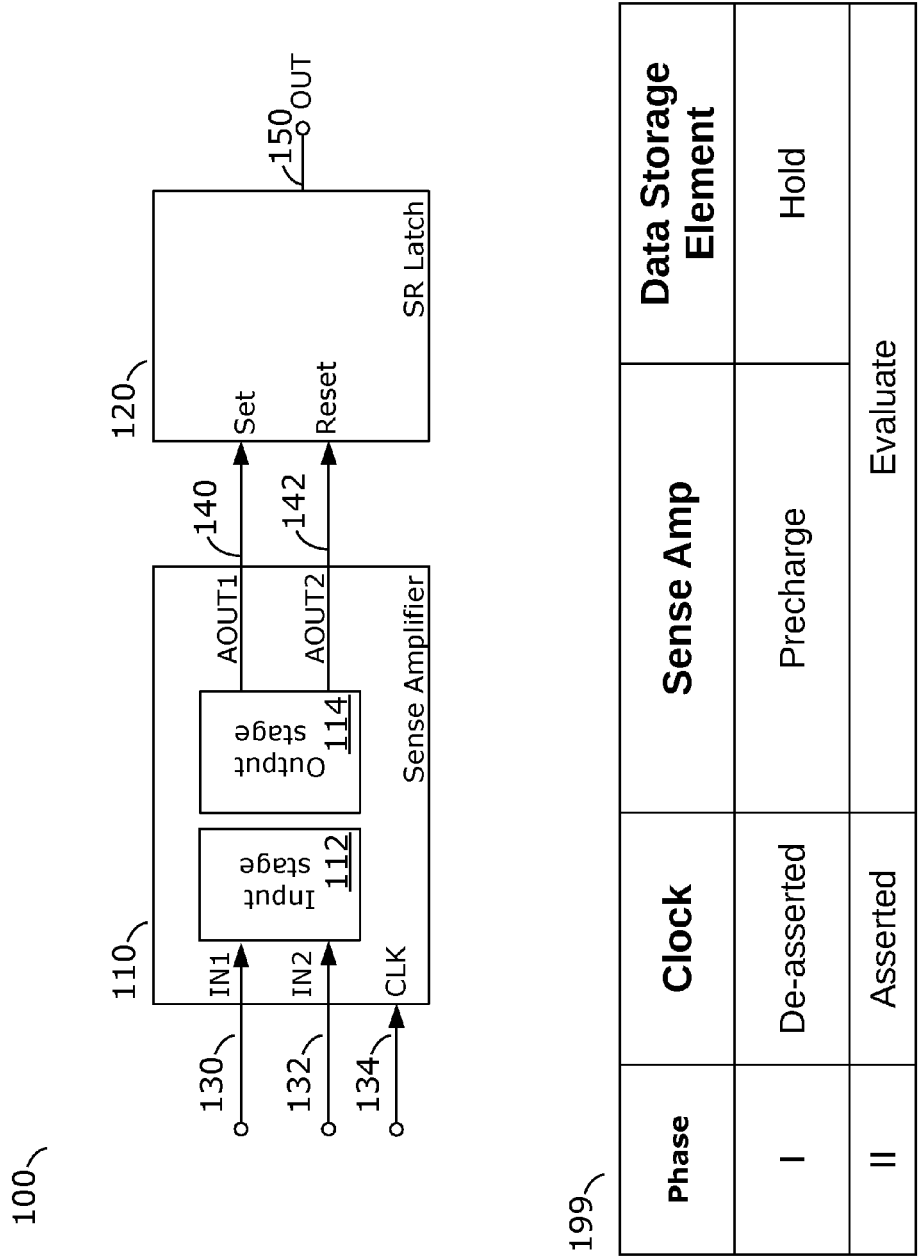
Fig. 1 – Prior Art

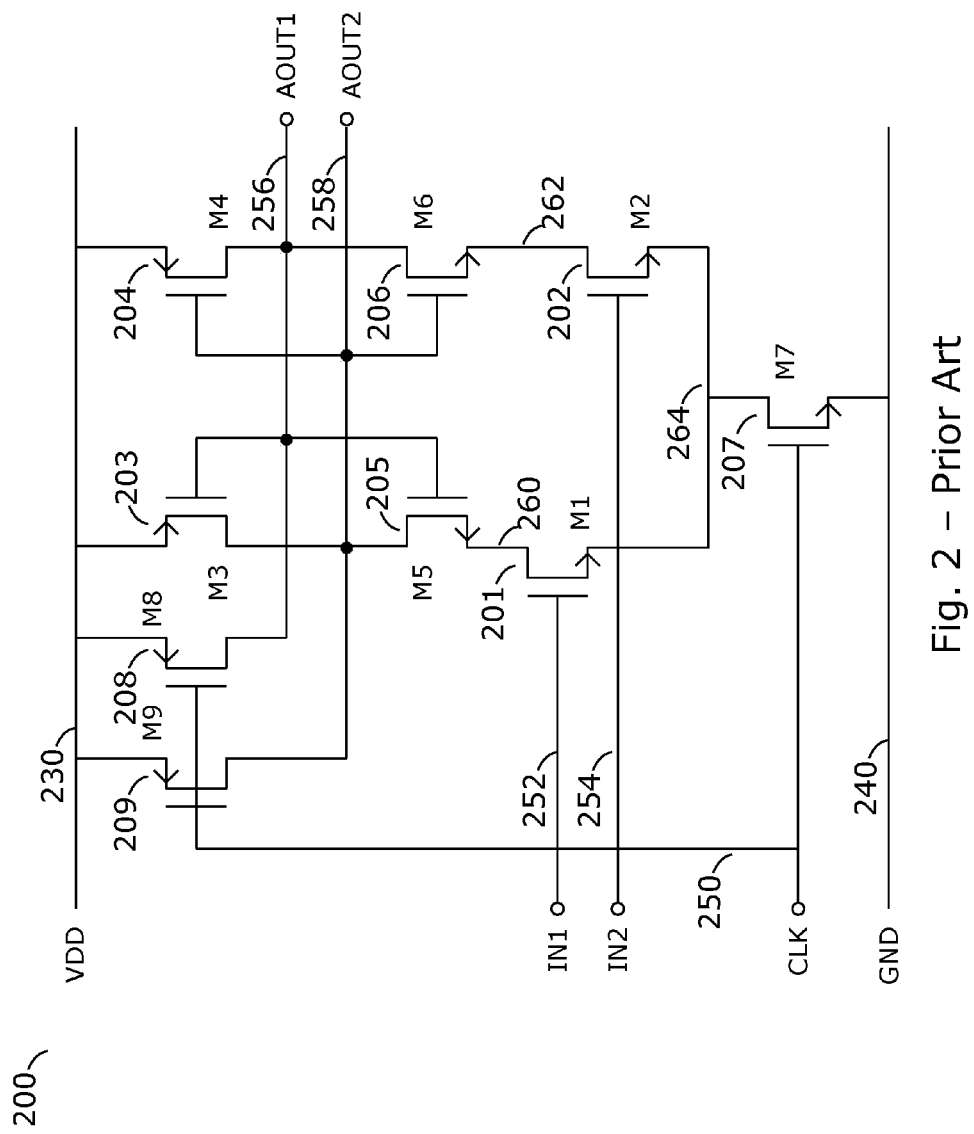
Fig. 2 – Prior Art

HIGH-SPEED CLOCKED COMPARATORS

CROSS REFERENCES TO RELATED APPLICATIONS

This application claims priority from U.S. Provisional Patent Application Ser. No. 62/211,186, entitled "A High-Speed Clocked Comparator" filed on Aug. 28, 2016, which is hereby incorporated by reference as if set forth in full in this application for all purposes.

BACKGROUND

Clocked comparators are used in systems that need to compare analog signals at specific times. Many such systems exist, including analog-to-digital converters, digital memories, disk drives, phase detectors for phase-locked loops, and receivers for serial communication systems. Clocked comparators are most often implemented as part of an integrated circuit fabricated in a semiconductor material. Their clocked operation enables reducing power while attaining high speed. However, many systems require increasingly high speeds where conventional designs reach their limit.

FIG. 1 illustrates a conventional clocked comparator 100 and its phases (table 199). It comprises a sense amplifier 110 and a set/reset (SR) latch 120 acting as a data storage element. Sense amplifier 110 may include an input stage 112, configured for comparing the levels of two analog data signals at its data inputs IN1 (130) and IN2 (132). It may further include an output stage 114 configured to amplify the comparison result to levels that SR latch 120 may interpret as digital data. Output signal AOUT1 is provided at node 140 and output signal AOUT2 is provided at node 142.

Clock input CLK 134 allows distinguishing two phases in the comparison process as illustrated in table 199. For instance, a first phase could be "precharge" and a second phase could be "evaluate". Three states are possible at the two outputs of sense amplifier 110: [1] both AOUT1 and AOUT2 de-asserted: no measurement; [2] AOUT1 asserted and AOUT2 de-asserted: IN1>IN2; and [3] AOUT1 de-asserted and AOUT2 asserted: IN1<IN2. A fourth state where both outputs would be asserted is undefined. Asserted (active) may be defined as high or low, where de-asserted (inactive) is defined as the opposite.

For the SR latch 120, the "precharge" phase translates as a "hold" phase, in which its inputs "Set" and "Reset" are de-asserted. The output signals of sense amplifier 110 are coupled to "Set" and "Reset" inputs of SR latch 120. When SR latch 120 receives a "Set" signal at node 140, it will assert its output signal on output OUT (node 150), indicating that the result of a comparison is that the level of the IN1 signal is higher than the level of the IN2 signal. When it receives a "Reset" signal at node 142, it will de-assert its output signal on output OUT (node 150), indicating that the result of a comparison is that the level of the IN2 signal is higher than the level of the IN1 signal. SR latch 120 will hold its output stage until a new signal "Set" or "Reset" changes it.

The polarity of active signals of sense amplifier 110 and SR latch 120 needs to match. For instance if SR latch 120 has inactive signals high and active signals low, then the "Set" signal 140 is asserted when it is low and de-asserted when it is high. Similarly, the "Reset" signal 142 is asserted when it is low and de-asserted when it is high. Therefore, in that case sense amplifier 110 needs to output high signals while in the "hold" phase, and in an "evaluate" phase it should assert one of its outputs 140 or 142 by pulling it low. A similar reasoning, with opposite signal polarities, holds when inactive signals are low and active signals are high.

FIG. 2 illustrates a conventional sense amplifier 200 for a clocked comparator. It has analog inputs IN1 and IN2 at nodes 252 and 254, a clock input at node 250, outputs AOUT1 at node 256 and AOUT2 at node 258. It has a power supply rail VDD at node 230 and a ground rail GND at node 240. The circuit comprises three additional nodes: node 260 coupling a source terminal of M5 (205) with a drain terminal of M1 (201); node 262 coupling a source terminal of M6 (206) with a drain terminal of M2 (202); and node 264 coupling source terminals of M1 (201) and M2 (202) with a drain terminal of M7 (207).

Sense amplifier 200 has an input stage comprising transistors M1 (201) and M2 (202) configured as a differential pair and coupled with the input nodes 252 and 254. It includes an output stage comprising transistors M3-M6 (203-206) coupled with the input stage at nodes 260 and 262, and coupled with the output nodes 256 and 258. The output stage is configured as a differential amplifier with positive feedback.

In a first operational cycle ("precharge" or "hold" phase), when the signal at input CLK (node 250) is low (de-asserted), transistor M7 (207) is off and transistors M8 (208) and M9 (209) are on. There is no bias current flowing through transistors M1-M6 (201-206), and therefore the sense amplifier 200 is effectively in a sleep mode. The output signals AOUT1 and AOUT2 at nodes 256 and 258 are pulled high (de-asserted) by transistors M8 (208) and M9 (209), respectively.

At the start of a second operational cycle ("evaluate" phase), when a signal at input CLK (node 250) goes high, transistor M7 (207) starts conducting, while M8 (208) and M9 (209) stop conducting. Transistor M7 (207) provides a bias current for the sense amplifier 200, running through transistor M1 (201) and/or M2 (202). Transistors M1 (201) and M2 (202) of the input stage compare two analog input signals, applied at the IN1 and IN2 inputs respectively (nodes 252 and 254). If the signal at IN1 (node 252) is higher than the signal at IN2 (node 254), then M1 (201) conducts more than M2 (202), and vice-versa. The transistor with the highest conductance carries more current, and pulls its output node (260 or 262) to a lower voltage than the output node of the other transistor.

The output stage M3-M6 (203-206) is bistable because of the positive feedback, and therefore a small differential signal applied at its inputs (nodes 260 and 262) quickly results in one output reaching a voltage close to VDD and the other output reaching a voltage close to GND. Once this occurs, either transistor M1 (201) or transistor M2 (202) is deprived of current, ending the comparison. The sense amplifier 200 remains in the same state for the remainder of the "evaluate" phase. One of the outputs AOUT1 and AOUT2 is asserted, and the other is de-asserted.

Despite the potentially fast output stage, some non-idealities limit the circuit's performance.

Firstly, output stage M3-M6 (203-206) would be at its fastest in its linear region, where its inputs 260 and 262 and its outputs 256 and 258 are near half the supply voltage VDD. However, at the end of the "precharge" phase, these nodes 256-262 are all near VDD and positive feedback is interrupted because neither M3 (203) nor M4 (204) conducts. The output stage M3-M6 (103-106) is essentially in sleep mode and needs to wake up first.

Secondly, the transistors M1-M2 (201-202), M5-M6 (205-206), and M8-M9 (208-209) are not ideal conductors, and in modern semiconductor fabrication processes they cannot be expected to match very well. The nodes 256-264 all have some parasitic capacitance to ground. During the "precharge" phase, nodes 256-264 are all coupled with VDD (230) through differently conductive paths. As a result, the parasitic node capacitances will charge toward VDD at different rates, and there will be some offset between nodes 256 and 258, and between nodes 260 and 262. Offsets of the parasitic node capacitances, or of the drive strengths of transistors M1 (201) and M2 (202), may force the output stage M3-M6 (203-206) in the wrong direction, resulting in inaccurate response.

Thirdly, because at the end of the "evaluate" phase one output (256 or 258) is high and the other is low, during the subsequent "hold" or "precharge" phase the nodes on one side of the positive feedback amplifier M3-M6 (203-206) will substantially lag the nodes on the other side while their parasitic capacitances are charging toward VDD. Therefore, the offset between nodes 256-258 and the offset between nodes 260-262 will feature a memory effect which may still be present at the start of the "evaluate" phase that follows. As a result, when a change occurs in the comparison between the input signals 252 and 254, the change will require a sufficient input voltage to overcome the memory effect (or stored charge) to put the comparator in the correct state because the offsets are forcing the positive feedback amplifier M3-M6 (203-206) in the wrong direction. The circuit effectively features hysteresis.

Because of these combined effects, the "evaluate" phase has an initially slow response, and a conventional clocked comparator may not be usable for applications that require the highest performance (speed) and accuracy.

SUMMARY

In a first aspect, embodiments of the invention include a method for accurately comparing levels of first and second analog signals at a high speed. The method comprises receiving the first analog signal on a first input of a differential pair of transistors and the second analog signal on a second input of the differential pair. It further comprises during a first phase of a clock signal: enabling an amplifier stage with positive feedback; comparing levels of the first and second analog signals in the differential pair to obtain a differential comparison result; and forwarding the differential comparison result to the amplifier stage with positive feedback. The amplifier stage with positive feedback amplifies the differential comparison result to generate with high speed a differential output signal that indicates which of the first and second analog signals has a higher level.

During a second phase of the clock signal, the amplifier stage with positive feedback is disabled; the differential comparison result is short-circuited, and the differential output signal is short-circuited.

In a second aspect, embodiments of the invention include a sense amplifier. It comprises a differential pair configured for receiving two analog input signals, and an amplifier with positive feedback whose inputs are coupled with outputs of the differential pair. The amplifier with positive feedback provides a sense amplifier output signal. The embodiments further include a first switch, configured for and capable of short circuiting the sense amplifier output signal.

Further embodiments may include second, third and fourth switches, configured for and capable of short circuiting a differential pair output signal, and coupling each of two differential pair output terminals to the supply voltage rail.

In a third aspect, embodiments of the invention include a method for accurately comparing levels of two analog signals at a high-speed. The method includes several steps during a first phase of a clock signal. The embodiments receive two analog signals and energize a first differential pair that provides output signals at approximately half the supply voltage. They also energize a first voltage excursion limiter and forward the two analog signals to the first differential pair. They compare the levels of the two analog signals in the first differential pair to obtain a differential comparison result as a differential signal added to the common mode voltage, and forward a first polarity of the differential comparison result to the first voltage excursion limiter. In the first voltage excursion limiter, they limit the first polarity of the differential comparison result to a small excursion. They store the limited first polarity of the differential comparison result on a first capacitance.

During a second phase of the clock signal, embodiments may further de-energize the first differential pair and the first voltage excursion limiter. They may forward the stored limited first polarity of the comparison result to an amplifier with positive feedback. In the amplifier with positive feedback, they may quickly amplify the stored limited first polarity of the comparison result to obtain an asserted signal and forward the asserted signal to a data storage element. Dependent on a type of the asserted signal, they may set or reset the data storage element to obtain a fast output signal of the comparison.

In a fourth aspect, embodiments of the invention include a sense amplifier comprising a first differential pair, a first voltage excursion limiter, and a first switch. The first differential pair inputs are configured for receiving two analog input signals and its differential outputs configured to operate at a common mode voltage between one quarter and three quarters of a power supply voltage. The first voltage excursion limiter is coupled with one of the two first differential pair outputs. the first switch is configured to energize the first differential pair and the first voltage excursion limiter during a first phase of a clock signal, and to de-energize the first differential pair and the first voltage excursion limiter during a second phase of the clock signal.

In a fifth aspect, embodiments of the invention include a method for fast comparison of two differential analog signals. The method includes receiving first and second differential input signals, and forwarding those to a first and a second differential quad. It further includes amplifying the first and second differential input signals and forwarding the amplified signals to a pair of differential data rails in which one amplified differential input signal is subtracted from the other. It then includes limiting an excursion of the differential data rails carrying the result of the subtraction.

In a sixth aspect, embodiments of the invention include a method for compensating input offset when comparing levels of two analog signals. The method comprises receiving a first analog signal on a first input of a first differential pair of transistors, and a second analog signal on a second input of the first differential pair, wherein the first differential pair has a first drive strength; comparing the first analog signal and the second analog signal in the first differential pair; forwarding a differential result of the analog signal comparison to differential data rails; receiving a differential control signal on two inputs of a second differential amplifier, wherein the second differential pair has a second drive strength that is smaller than the first drive strength; comparing the differential control signal in the second differential pair; forwarding a differential result of the differential control signal comparison to the differential data rails; using a data rail capacitance to store the comparison results; and limiting an excursion of the differential data rails.

BRIEF DESCRIPTION OF THE DRAWINGS

The invention will be described with reference to the drawings, in which:

FIG. 1 illustrates a conventional clocked comparator and its phases;

FIG. 2 illustrates a conventional sense amplifier for a clocked comparator;

DETAILED DESCRIPTION

Clocked comparators are used in systems that need to compare two analog signals at specific times. Such systems include, for example, analog-to-digital converters, digital memories, disk drives, phase detectors for phase-locked loops, and receivers for serial communication systems. Clocked comparators typically comprise a sense amplifier and a data storage element. An input clock allows two phases of operation, for instance "evaluate" and "hold" or "precharge". During the "hold" phase, conventional clocked comparators typically interrupt current for the sense amplifier, which effectively puts it in sleep mode. Waking up the sense amplifier early in the "evaluate" phase costs time, which limits performance of the clocked comparator. The problem is exacerbated by offsets in the transistors and hysteresis due to parasitics. Embodiments of the invention address these problems, resulting in accurate and high-speed operation.

In this document, a signal may be called "asserted" when it is active, which could for instance be when it has a high or a low voltage. A signal may be called "de-asserted" when it is inactive, which may for instance be the opposite voltage (i.e., low or high, respectively).

"Differential pair", as used in this document, means two transistors of the same type and polarity, for instance both NMOS (N-type) or both PMOS (P-type). Each transistor has an input terminal, here called "gate"; a reference terminal, here called "source"; and an output terminal, here called "drain". The source terminals of the two transistors in a differential pair are coupled to each other. Two single-ended input signals, or one differential input signal, may be applied at the gate terminals, whereas a differential output signal may be obtained from the drain terminals.

Figure 3A:
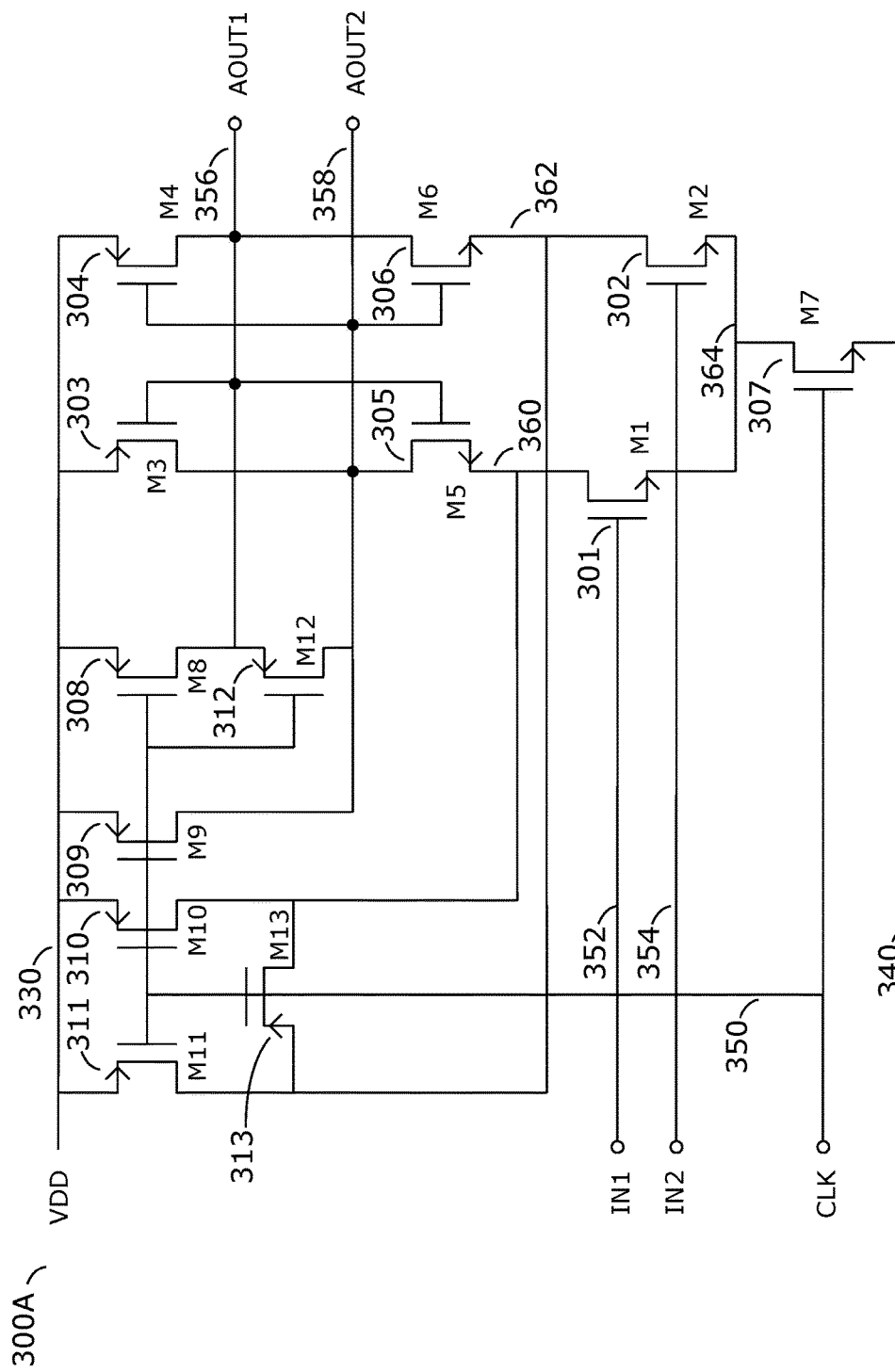
FIGS. 3A-B illustrate low-power sense amplifiers according to embodiments of the invention.
Figure 3B:
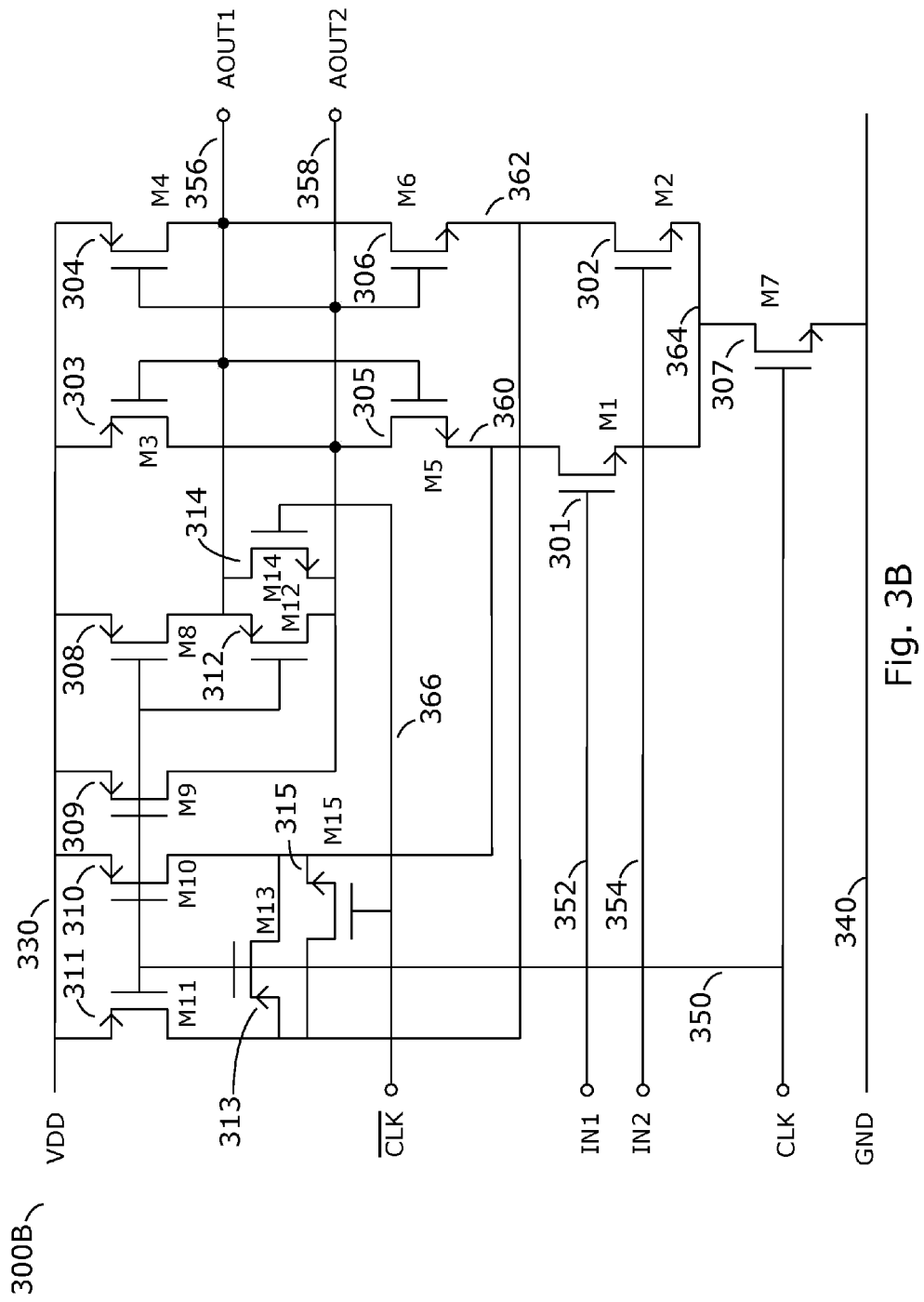

FIGS. 3A-B illustrate low-power sense amplifiers according to embodiments of the invention. FIG. 3A illustrates a low-power sense amplifier 300A. It reduces the problems caused by offset and hysteresis, thereby improving the circuit's accuracy, while conserving all power-saving benefits of a sleep mode during a "precharge" phase. Sense amplifier 300A comprises differential pair M1-M2 (301-302). It has inputs at nodes 352 and 354 and outputs at nodes 360 and 362. The inputs receive the input signals IN1 and IN2. It further comprises an amplifier with positive feedback M3-M6 (303-306), which has inputs at nodes 360 and 362, coupled with the differential pair outputs. It comprises two sense amplifier output terminals 356 and 358 coupled with outputs of the amplifier with positive feedback M3-M6 (303-306). It further comprises a first switch M12, configured for and capable of short circuiting an output signal present between the sense amplifier 300A output terminals 356 and 358. The first switch M12 has a reference terminal, an input terminal, and an output terminal. The output terminal and the reference terminal are coupled to sense amplifier 300A output terminals 356 and 358.

Embodiments of sense amplifier 300A may further comprise a second switch M13 (313), configured for and capable of short circuiting differential pair M1-M2 (301-302) outputs 360 and 362. The second switch M13 has a reference terminal, an input terminal, and an output terminal. The reference terminal is coupled with one of the differential pair outputs (either 360 or 362) and the output terminal is coupled with the other of the differential pair M1-M2 (301-302) outputs (362 or 360, respectively).

In some embodiments, the first switch comprises a transistor, which may be either N-type or P-type. In some further embodiments, the first switch comprises both an N-type and a P-type transistor, which may be configured as a transmission gate. Similarly, in some embodiments, the second switch comprises a transistor, which may be either N-type or P-type. In some further embodiments, the second switch comprises both an N-type and a P-type transistor, which may be configured as a transmission gate.

Embodiments of the invention may further comprise third and fourth switches M10-M11 (310-311), configured for and capable of short circuiting the sense amplifier 300A output signals present on output terminals 356 and 358 to supply voltage rail 330. Again, the third and fourth switches may each comprise a transistor, which may be either N-type or P-type.

Embodiments of sense amplifier 300A receive a clock signal CLK on node 350 which may be coupled with input terminals of each of the switches M7-M13 (307-313). When the CLK signal at node 350 is asserted (Phase I, "evaluation"), switch M7 is on, energizing both the differential pair M1-M2 (301-302) and the amplifier with positive feedback M3-M6 (303-306). However, switches M8-M13 (308-313) are off. When the CLK signal at node 350 is de-asserted (Phase II, "precharge"), switch M7 is off, de-energizing both the differential pair M1-M2 (301-302) and the amplifier with positive feedback M3-M6 (303-306). However, switches M8-M13 (308-313) are on. They short circuit output terminals 356 and 358 both to each other and to the supply voltage rail 330, and they short circuit differential pair M1-M2 (301-302) outputs 360 and 362 to each other and to the supply voltage rail 330. In this fashion, during the sense amplifier "precharge" phase (phase II), offsets are eliminated and all nodes are kept at known voltages, reducing the offset and hysteresis problems.

In an alternative embodiment, the sense amplifier in FIG. 3A is mirrored versus the supply and ground rails. i.e., the supply rail 330 and ground rail 340 are swapped. All N-channel transistors (M1, M2, M5, M6, and M7) become P-channel transistors, and all P-channel transistors (M3, M4, M8-M13) become N-channel transistors.

In yet alternative embodiments, two phases of the clock may be available, for instance CLK and $\overline{CLK}$, where the overline indicates that this signal is active low. The signals CLK and $\overline{CLK}$ are asserted with opposite control signals. In such embodiments, each of the switches M7-M13 may be either an N-channel or a P-channel transistor, provided that it is coupled with the correct phase CLK or $\overline{\text{CLK}}$ of the clock.

In further alternative embodiments, parasitic capacitances (not shown) between nodes 360-362 and GND may be enhanced by capacitive devices (e.g. varactors). Such capacitive devices could have a controllable capacitance, to allow for balancing the load on nodes 360 and 362.

FIG. 3B illustrates a low-power sense amplifier 300B according to an embodiment of the invention. Sense amplifier 300B is similar to sense amplifier 300A, with the addition of a CLK input at node 366, respectively, and transistors M14 (314) and M15 (315). These are implemented as N-channel transistors. CLK input node 366 is coupled with the gates of transistors M14 (314) and M15 (315). By driving M13 (313) and M15 (315) with opposite phases of a clock signal, these transistors operate as a "transmission gate" (a parallel combination of an N-channel and a P-channel transistor). Similarly, by driving M12 (312) and M14 (314) with opposite phases of the clock signal, these transistors also operate as a transmission gate. The transmission gate including both N-channel and P-channel transistors may have the advantage that the voltages (potentials) on the nodes being electrically coupled by the transmission gate are irrelevant, and the transmission gate acts as a more ideal switch, better able to equalize the two potentials. Additionally, the impedance of two transistors in parallel may be lower than of a single transistor, further improving high-speed performance.

A method for accurately comparing levels of two analog signals at a high-speed according to an aspect of the invention comprises: receiving a first analog signal on a first input (e.g., node 352) of a differential pair of transistors (e.g., M1-M2, 301-302) and a second analog signal on a second input (e.g., node 354) of the differential pair; during a first phase of a clock signal (e.g. 350, with the clock asserted): enabling an amplifier stage with positive feedback (e.g., M3-M6, 303-306); comparing levels of the first and second analog signals (e.g., at nodes 352 and 354) in the differential pair (e.g., M1-M2, 301-302) to obtain a differential comparison result (e.g., at nodes 360 and 362); forwarding the differential comparison result to the amplifier stage with positive feedback (e.g., M3-M6, 303-306); in the amplifier stage with positive feedback, amplifying the differential comparison result to generate with high speed a differential output signal (e.g., at nodes 356 and 358) that indicates which level is higher; during a second phase of the clock signal (clock de-asserted): disabling the amplifier stage with positive feedback (e.g., M3-M6, 303-306); short-circuiting the differential comparison result (e.g., at nodes 360 and 362); and short-circuiting the differential output signal (e.g., at nodes 356 and 358).

In a further embodiment, the method comprises coupling the short-circuited differential comparison result (e.g., at nodes 360 and 362) with a supply voltage (e.g. VDD at node 330) or with a ground voltage during the second phase of the clock signal.

In a yet further embodiment, the method comprises coupling the short-circuited differential output signal (e.g., at nodes 356 and 358) with the supply voltage (e.g. VDD at node 330) or with the ground voltage during the second phase of the clock signal.

Figure 4A:
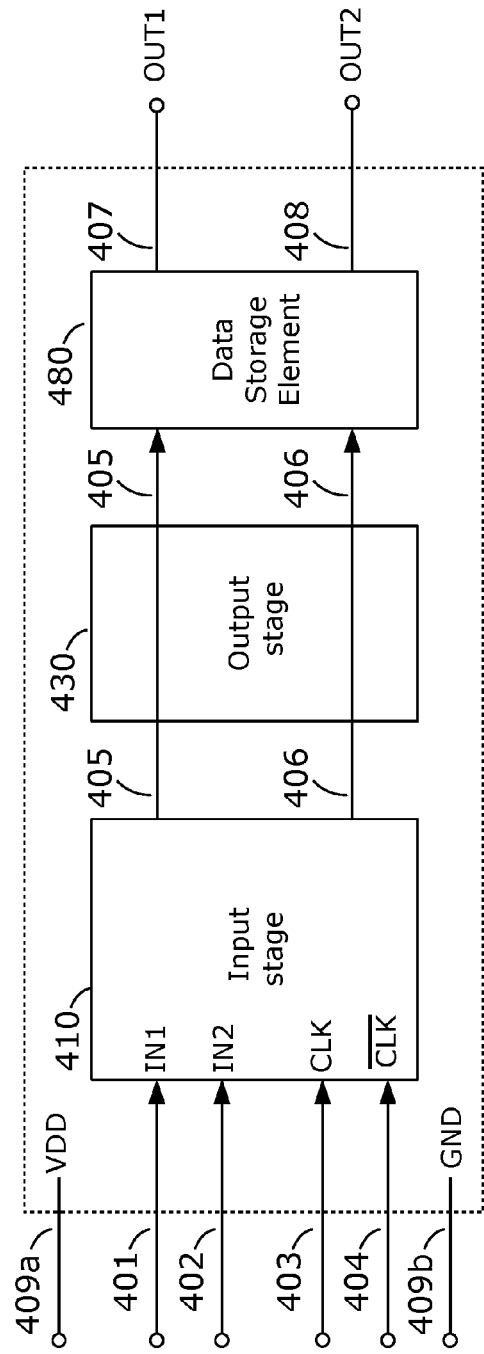
FIGS. 4A-H illustrate embodiments of a speed-optimized clocked comparator.

FIGS. 4A-H illustrate embodiments of a speed-optimized clocked comparator 400 with its phases (table 499 in FIG. 4A). In these embodiments, capacitances or parasitic capacitances of relevant nodes are precharged close to half the supply voltage to achieve the highest speeds. Some power may be sacrificed to make this possible. Circuits may be symmetric between the supply and ground rails to obtain rest states close to half the supply voltage.

As in the embodiments before, the clock defines two phases of the comparison process. For a clear understanding, see table 499, it may be suitable to identify these as [1] "evaluate and precharge" (CLK is asserted); and [2] "copy and hold" (CLK is de-asserted). Note the difference between these phases and those described with respect to prior art and with respect to embodiments of the invention as depicted in FIGS. 3A-B.

FIG. 4A illustrates the main components and the coupling of signals into, inside, and out of the clocked comparator 400. First and second analog input signals IN1 and IN2 are provided to clocked comparator 400 at input nodes 401 and 402, respectively. A clock signal CLK is provided at node 403, and an inverted clock signal $\overline{\text{CLK}}$ is provided at node 404, where the overline indicates that this signal is active low. A supply voltage VDD is provided at supply rail 409a and a ground reference GND is provided at ground rail 409b. Input stage 410 receives the first and second analog input signals IN1 and IN2. Input stage 410 is coupled to output stage 430 as well as to data storage element 480 via data rails 405 and 406. Data storage element 480 provide output signals OUT1 and OUT2 on output nodes 407 and 408, respectively. Data storage element block 480 can generally comprise one or more data storage elements, such as a set-reset latch, a static D-type flip-flop, a dynamic D-type flip-flop, and/or (an)other digital memory element(s) that can store one or more bits of information.

Figure 4B:
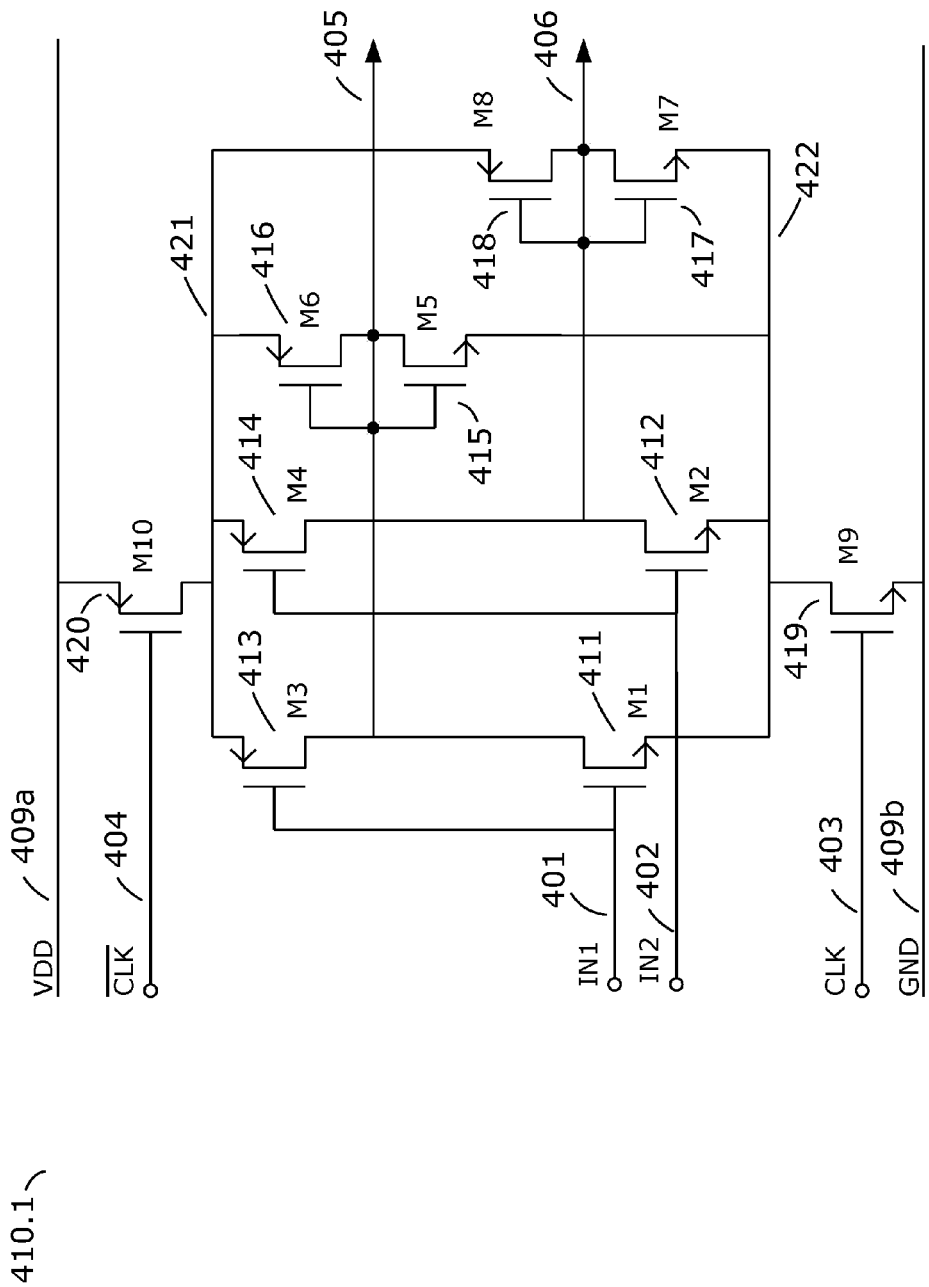

FIG. 4B illustrates input stage 410.1 according to an embodiment of the invention. It comprises a differential quad M1-M4 (411-414) that receives the IN1 and IN2 analog signals to compare, on input nodes 401 and 402. The differential quad provides its differential output signal to data rails 405 and 406. Data rails 405 and 406 may carry the differential quad differential output signal as a differential signal superimposed on a common mode voltage approximately centered in between the ground and power supply rails. The common mode voltage does not need to be exactly at half the power supply voltage. It needs to be at a level at which input transistors of a subsequent output stage can operate in their linear region, where they are fastest. This is often easiest if the common mode voltage is between one quarter and three quarters of the power supply voltage.

"Differential quad", as used in this document, means four transistors of the same technology, e.g. CMOS. A first and a second transistor have a first polarity, e.g. NMOS (or N-type). A third and a fourth transistor have a second polarity, opposite the first polarity, e.g. PMOS (or P-type). Each transistor has an input terminal, here called "gate"; a reference terminal, here called "source"; and an output terminal, here called "drain". The source of the first transistor M1 (e.g., 411) is coupled to the source of the second transistor M2 (e.g., 412). The source of the third transistor M3 (e.g., 413) is coupled to the source of the fourth transistor M4 (e.g., 414). The gate of the first transistor M1 (e.g., 411) is coupled with the gate of the third transistor M3 (e.g., 413). The gate of the second transistor M2 (e.g., 412) is coupled with the gate of the fourth transistor M4 (e.g., 414). The drain of the first transistor M1 (e.g., 411) is coupled with the drain of the third transistor M3 (e.g., 413). The drain of the second transistor M2 (e.g., 412) is coupled with the drain of the fourth transistor M4 (e.g., 414). A first input signal may be provided to the joint gates of the first and third transistors M1 an M3 (e.g., 411 and 413). A second input signal may be provided to the joint gates of the second and fourth transistors M2 and M4 (e.g., 412 and 414). A first output signal may be obtained from the joint drains (e.g., at node 405) of the first and third transistors M1 an M3 (e.g., 411 and 413). A second output signal (e.g., at node 406) may be obtained from the joint drains of the second and fourth transistors M2 and M4 (e.g., 412 and 414). A first bias voltage or current may be provided to the joint sources of the first and second transistors M1 and M2 (e.g., 411 and 412), and a second bias voltage or current may be provided to the joint sources of the third and fourth transistors M3 and M4 (e.g., 413 and 414).

One way of interpreting a differential quad is by viewing it as a combination of two differential pairs of opposite polarity, mirrored and stacked onto each other. This way it is easy to see that a differential quad operates as an amplifier of which both the differential input signal and the differential output signal have common mode components somewhere midway a supply voltage rail and a ground rail.

Transistors M5-M6 (415-416) act on the signal provided on data rail node 405, pulling it back towards half the supply voltage. Similarly, transistors M7-M8 (417-418) act on the signal provided on data rail node 406, pulling it back towards half the supply voltage. In this manner, transistors M5-M8 (415-418) limit the voltage excursions of the data rail nodes 405 and 406, keeping the node voltages close to half the supply voltage. A small differential voltage remains between data rail nodes 405 and 406, the polarity of which depends (inverted) on the comparison of the IN1 and IN2 input signal voltages. A reason for limiting the excursion of the data rail nodes 405 and 406 is to reduce effects of positive feedback in the output stage (discussed later) that may have occurred during a previous phase.

The input stage is active only when the clock is asserted (CLK on node 403 is high and $\overline{CLK}$ on node 404 is low), hence in the "evaluate and precharge" phase. Node 403 controls transistor M9 (419) and node 404 controls transistor M10 (420). In this phase, node 421 will carry a voltage close to VDD and node 422 will carry a voltage close to GND. Transistors M9 (419) and M10 (420) allow a bias current to energize the input stage.

However, in the "copy and hold" phase, transistors M9 (419) and M10 (420) are switched off. There is no longer a bias current running through the input stage 410.1; none of the transistors M1-M10 (411-420) carries a current and therefore the input stage 410.1 is not active in this phase. The input signals no longer have any impact on the circuit state, and data rail nodes 405 and 406 are no longer kept close to half the supply voltage. At the start of this phase, nodes data rail 405 and 406 have a small residual offset, due to their parasitic capacitances and the result of the input signal comparison in the just ended "evaluate and precharge" phase.

Figure 4C:
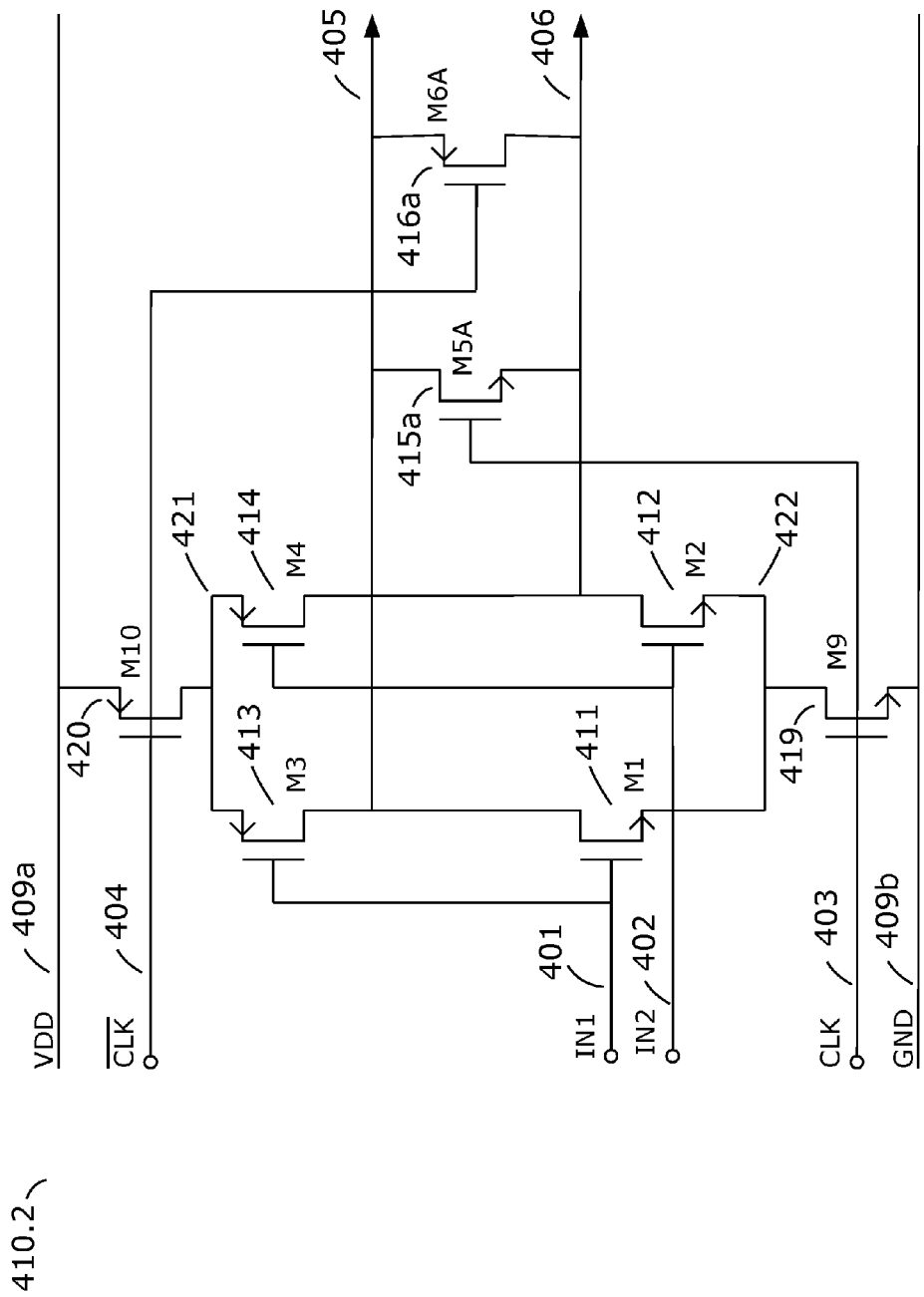

FIG. 4C shows an example embodiment 410.2 of the invention with a different topology for limiting the voltage excursion on the data rails 405 and 406. In the "evaluate and precharge" phase, the clock is asserted (CLK on node 403 is high and $\overline{CLK}$ on node 404 is low). Therefore, transistors M5A (415a) and M6A (416a) will conduct and keep the voltages on the data rails 405 and 406 close to each other. In the "copy and hold" phase, transistors M5A (415a) and M6A (416a) no longer conduct, and voltage excursion limitation is disabled.

Figure 4D:
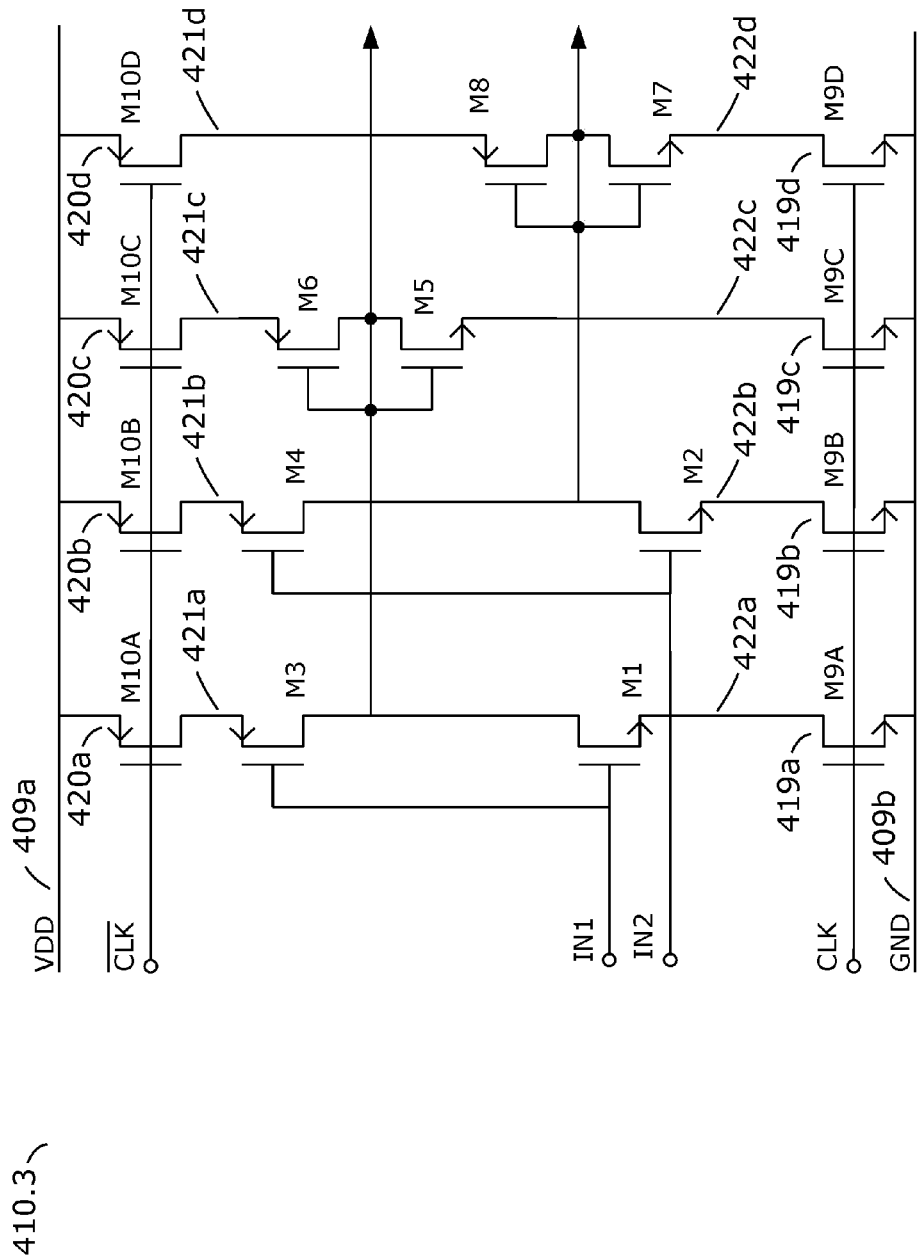

While FIGS. 4B and 4C show example embodiments 410.1 and 410.2 in which transistors M9 (419) and M10 (420) act as switches for enabling and disabling differential quad M1-M4 (411-414) and voltage excursion limiters M5-M6 (415-416) and M7-M8 (417-418), other arrangements are equally viable. For instance, FIG. 4D illustrates an embodiment 410.3 in which each of the four paths through which current flows from VDD (409a) to GND (409b) has its own set of enabling/disabling transistors. Both M9 (419) and M10 (420) are split in four separate transistors M9A-M9D (419a-419d) and M10A-M10D (420a-420d), each controlled by CLK or $\overline{CLK}$, respectively. Nodes 421 and 422 would are split into 4 separate nodes 421a-421d and 422a-422d. The sources of transistors M1, M2, M5 and M7 are no longer coupled to each other, and the sources of transistors M3, M4, M6 and M8 are no longer coupled to each other. In yet other embodiments, enabling and disabling of some of the paths may be combined, whereas enabling and disabling of other paths may be kept separate.

Figure 4E:
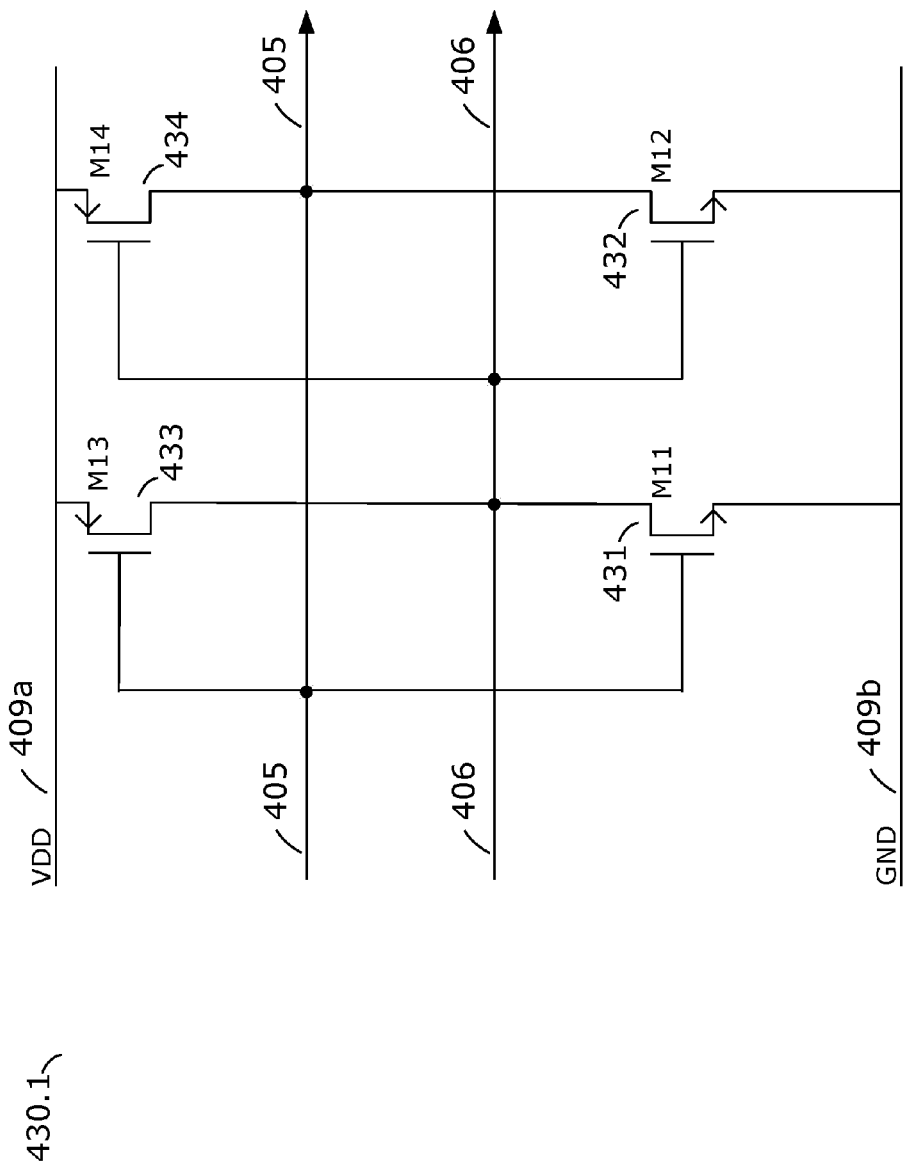

FIG. 4E illustrates the output stage 430.1 according to an embodiment of the invention. Transistors M11-M14 (431-434) are configured as an amplifier with positive feedback. In order to save energy and to allow it to be overridden by the input stage 410, its drive strength is not very large—this circuit is always on. The input signals are provided by the input stage 410 (see FIGS. 4A-4D) on data rails 405 and 406. The same data rails 405 and 406 are also the outputs of output stage 430.1.

The amplifier with positive feedback M11-M14 (431-434) is always on, regardless of whether the phase is "evaluate and precharge" or "copy and hold". However, in the "evaluate and precharge" phase, transistors M5-M8 (415-418) in input stage 410 limit the voltage excursion of the data rails 405 and 406. As a result, at the end of the "evaluate and precharge" phase, the data rails have a common mode voltage close to half the supply voltage VDD, and a small differential voltage determined by the comparison result of input signals IN1 and IN2 rather than by a previous comparison result stored in the amplifier with positive feedback M11-M14 (431-434). At the start of the "copy and hold" phase, transistors M5-M8 (415-418) in input stage 410 no longer limit the voltage excursion of the data rails 405 and 406. Amplifier with positive feedback M11-M14 (431-434), with its inputs and outputs at about half the supply voltage, is at its fastest operational point. The positive feedback, here embodied by coupling its output at the drain terminals of M11 and M13 (431, 433) back to its input at data rail 406 and by coupling its output at the drain terminals of M12 and M14 (432, 434) back to its input at data rail 405, allows for quick escalation of the voltage excursion of data rails 405 and 406. One of the data rails will very quickly move towards the supply voltage VDD and the other towards GND. The voltages will stay at those values until the start of the next "evaluate and precharge" phase, at which time they once more will move back to about half the supply voltage VDD because of the limiting action of transistors M5-M8 (415-418) in input stage 410.

Figure 4F:
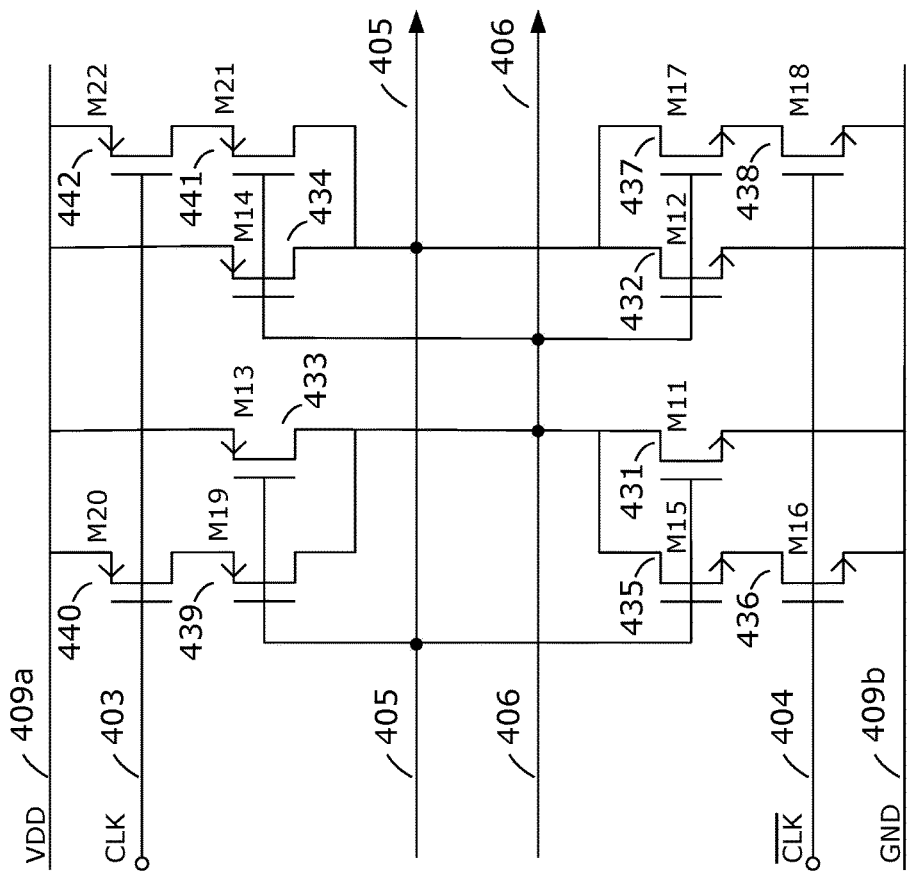

FIG. 4F illustrates optional elements in the output stage 430.2 according to a further embodiment of the invention. Amplifier with positive feedback M11-M14 (431-434) is given a weak drive strength. This saves energy in the "evaluate and precharge" phase, since the circuit is always on. In the "evaluate and precharge" phase, the CLK signal at node 403 is high, and $\overline{CLK}$ at node 404 is low. Therefore, during this phase, transistors M15-M22 (435-442) are non-conducting and do not contribute to the operation.

When CLK on node 403 goes low and $\overline{CLK}$ at node 404 goes high, the "copy and hold" phase starts. This switches on transistors M16 (436), M18 (438), M20 (440) and M22 (442), allowing transistors M15 (435), M17 (437), M19 (439) and M21 (441) to strengthen the transistors M11-M14

(431-434) of the amplifier with positive feedback. The amplifier gains strength, significantly increasing its capability to act on data rails 405 and 406.

During the "copy and hold" phase, input stage 410 is no longer energized and no longer limits the voltage excursion on data rails 405 and 406. As a result, the output stage 430 now has both the speed and the strength to quickly amplify the signal, and pull one of the data rails 405 and 406 toward VDD and the other to GND. The data rails 405 and 406 will stay at these voltages until the next "evaluate and precharge" phase starts.

Figure 4G:
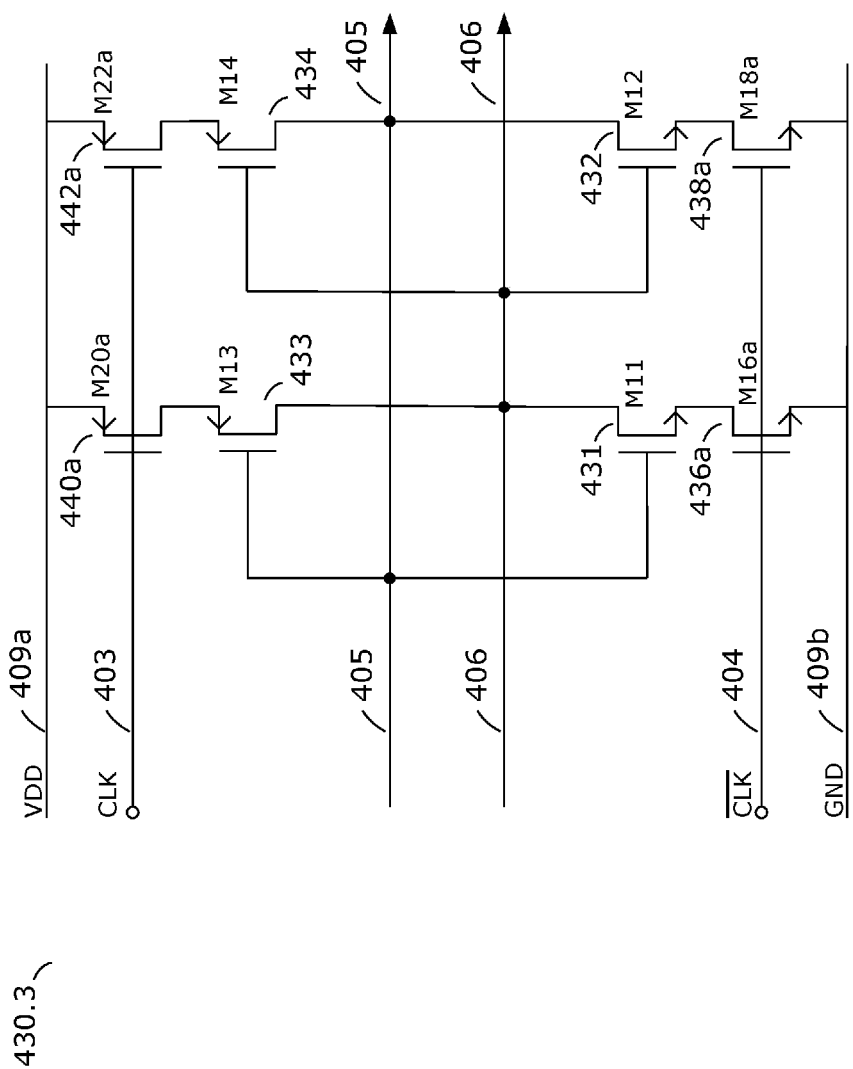

FIG. 4G illustrates an alternative embodiment 430.3 of the output stage. Amplifier with positive feedback M11-M14 (431-434) is switched off in the "evaluate and precharge" stage, when the clock is asserted (CLK on node 403 is high and $\overline{CLK}$ on node 404 is low). In this stage, the input stage 410 is active, and its output signal on lines 405 and 406 has a voltage differential that is limited by M5-M8 (415-418). When the "copy and hold" phase starts, the voltage excursion on data rails 405 and 406 is no longer limited, and the output stage is energized. Amplifier with positive feedback M11-M14 (431-434) is switched on, quickly further driving data rails 405 and 406 apart. This embodiment may use less power than the embodiment 430.2 of FIG. 4F, possibly at the expense of some speed.

Figure 4H:
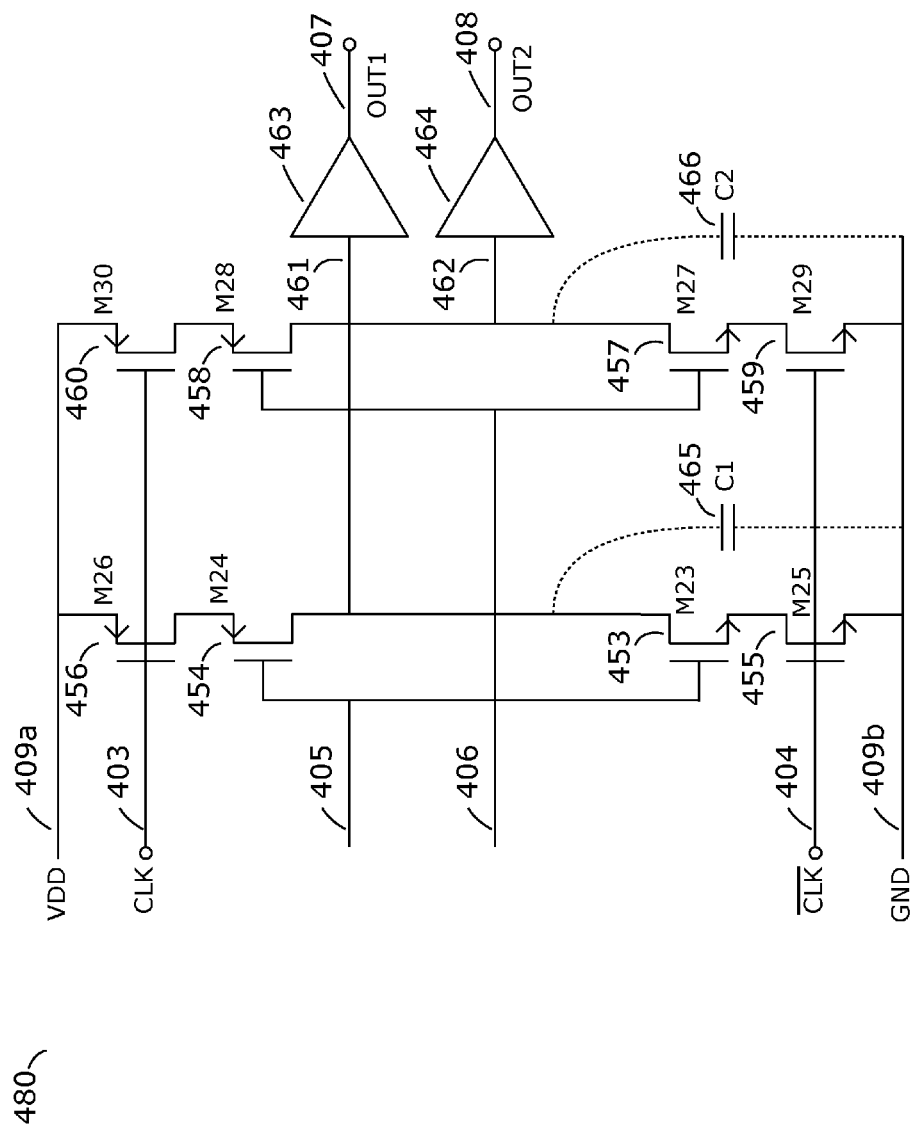

FIG. 4H illustrates data storage element 480 according to an embodiment of the invention. In this case, data storage element 480 includes a dynamic D-type flip-flop. The signal on data rail 405 is provided to inverting amplifier M23-M24 (453-454) and the signal on data rail 406 is provided to inverting amplifier M27-M28 (457-458). Inverting amplifier M23-M24 (453-454) provides an output signal on node 461, which is buffered by buffer 463 to provide clocked comparator 400 output signal OUT1 on node 407. Inverting amplifier M27-M28 (457-458) provides an output signal on node 462, which is buffered by buffer 464 to provide clocked comparator 400 output signal OUT2 on node 408. Node 461 may have a parasitic capacitance C1 (465) to ground rail 409b and node 462 may have a parasitic capacitance C2 (466) to ground rail 409b.

In the "copy and hold" phase, the CLK signal at node 403 is low, and $\overline{CLK}$ at node 404 is high. Transistors M25-M26 (455-456) and M29-M30 (459-460) conduct. Therefore, during this phase, transistors M23-M30 (453-460) are energized, enabling inverting amplifiers M23-M24 (453-454) and M27-M28 (457-458) to operate. A signal on data rail 405 is inverted and the inverted signal is provided at node 461, rapidly charging parasitic capacitance C1 (465). Similarly, a signal on data rail 406 is inverted, and the inverted signal is provided at node 462, rapidly charging parasitic capacitance C2 (466). The signal on node 461 is buffered by buffer 463, and determines the output signal OUT1 on node 407. The signal on node 462 is buffered by buffer 464, and determines the output signal OUT2 on node 408. In summary, during the "copy and hold" phase, the output signals OUT1 and OUT2 on nodes 407 and 408 may change.

In the "evaluate and precharge" phase, the CLK signal at node 403 is high, and $\overline{CLK}$ at node 404 is low. Therefore, during this phase, transistors M23-M30 (453-460) are non-conducting and do not contribute to the operation. Charge remaining on parasitic capacitance C1 (465) on node 461 is buffered by buffer 463, and determines the output signal OUT1 on node 407. Buffer 463 separates parasitic capacitance C1 (465) from any external load on node 407, preventing a rapid decline of its output signal. Similarly, charge remaining on parasitic capacitance C2 (466) on node 462 is buffered by buffer 464, and determines the output signal OUT2 on node 408. Buffer 464 separates parasitic capacitance C2 (466) from any external load on node 408, preventing a rapid decline of its output signal. In summary, during the "evaluate and precharge" phase, the output signals OUT1 and OUT2 on nodes 407 and 408 retain the values they had in the prior "copy and hold" phase.

Embodiments may implement buffers 463 and/or 464 as limiting amplifiers, e.g. CMOS inverters. The gain of limiting amplifiers help to amplify signals on data rails 405 and 406 to full logic levels.

A method for accurately comparing levels of two analog signals at a high-speed according to an aspect of the invention comprises: during a first phase of a clock signal (e.g., at 403/404): receiving two analog signals (e.g., at 401 and 402); energizing a first differential pair (e.g., 411 and 412), wherein the first differential pair is configured to provide differential output signals (e.g., 406 and 405) at a common mode voltage approximately centered in between ground (e.g., 409b) and power supply (e.g., 409a) rails; energizing a first voltage excursion limiter (e.g., 417/418); forwarding the two analog signals to the first differential pair (e.g., 411 and 412); comparing the levels of the two analog signals (e.g., at 401 and 402) in the first differential pair (e.g., 411 and 412) to obtain a differential comparison result (e.g., at 406 and 405) as a differential signal added to the common mode voltage; forwarding a first polarity (e.g. at 406) of the differential comparison result (e.g., at 406 and 405) to a first voltage excursion limiter (e.g., 417/418); in the first voltage excursion limiter (e.g., 417/418), limiting the first polarity (e.g. at 406) of the differential comparison result to a small excursion; storing the limited first polarity (e.g. at 406) of the differential comparison result (e.g., at 406 and 405) on a first capacitance (not shown); during a second phase of the clock signal (e.g., at 403/404): de-energizing the first differential pair (e.g., 411 and 412); de-energizing the first voltage excursion limiter (e.g., 417/418); forwarding the stored limited first polarity (e.g. at 406) of the comparison result to an amplifier with positive feedback (e.g., 431-434); in the amplifier with positive feedback (e.g., 431-434), quickly amplifying the stored limited first polarity (e.g. at 406) of the comparison result to obtain an asserted signal (e.g. at 406); forwarding the asserted signal (e.g. at 406) to a data storage element (e.g., 480); dependent on a type of the asserted signal, setting or resetting the data storage element (e.g., 480) to obtain a fast output signal (e.g. 408) of the comparison.

A further embodiment of the method comprises energizing or additionally energizing the amplifier with positive feedback during the second phase of the clock signal.

Yet further embodiments may include forwarding the asserted signal to a second capacitor during the second phase of the clock and buffering the forwarded asserted signal on the second capacitor to obtain an accurate high-speed comparison output signal.

Figure 5:
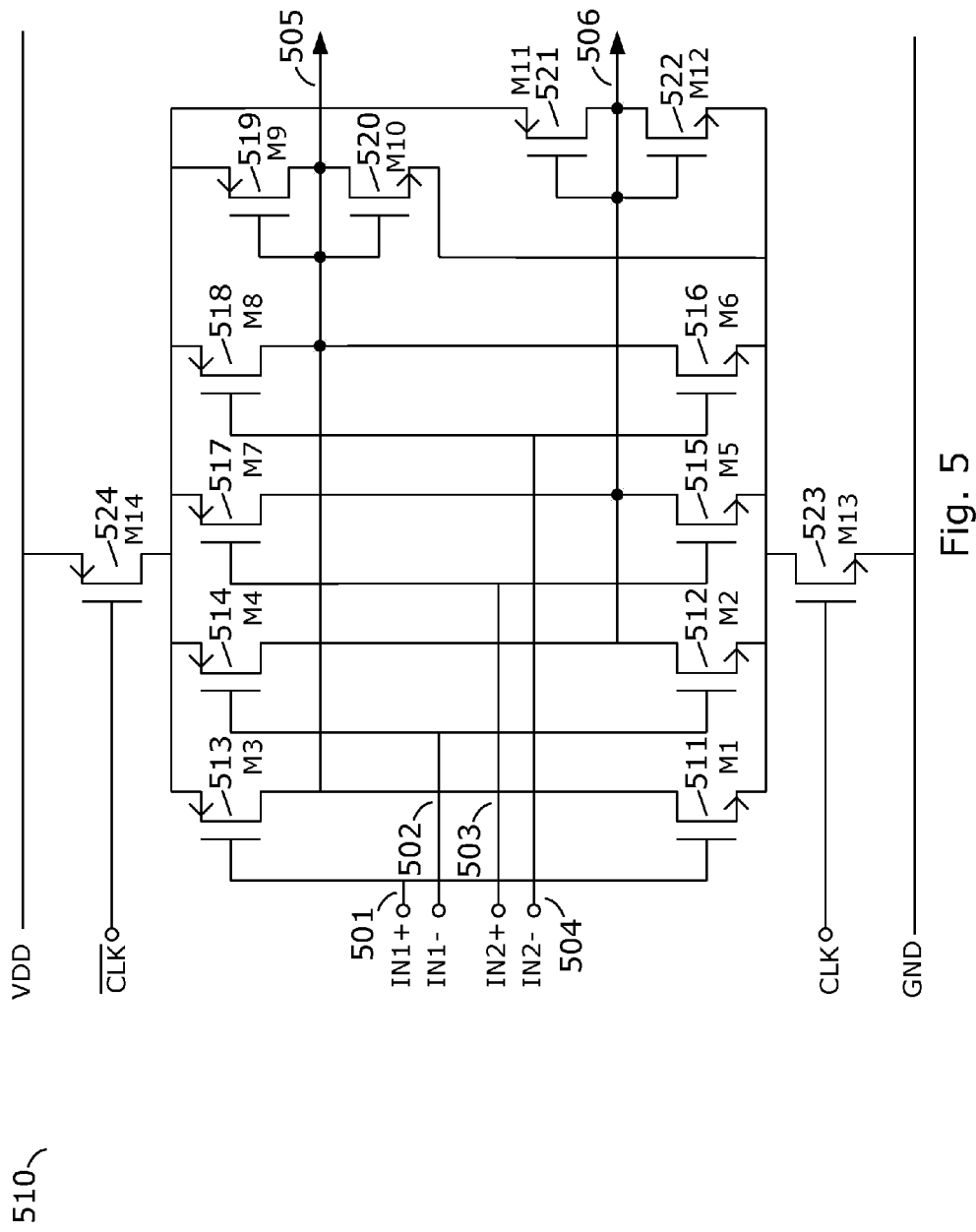
FIG. 5 illustrates a sense amplifier input stage for comparing two differential input signals according to an embodiment of the invention.

FIG. 5 illustrates a sense amplifier input stage 510 for comparing two differential input signals according to an embodiment of the invention. The circuit diagram is comparable to FIG. 4B, which is for comparing single-ended input signals. However, this sense amplifier is capable of comparing a first differential input signal IN1+/IN1− (501-502) with a second differential input signal IN2+/IN2− (503-504). Transistors M1-M4 (511-514) form a first differential quad, acting on the first differential input signal IN1+/IN1− (501-502). Transistors M5-M8 (515-518) form a second differential quad, acting on the second differential input signal IN2+/IN2− (503-504). The first and the second differential quads may have equal drive strength, i.e. equal transconductance and equal output impedance. Differential output currents of the two differential quads are subtracted from each other in data rails 505 and 506.

Transistors M9-M12 (519-522) limit the voltage excursion of the data rails 505 and 506, keeping their voltages close to half the supply voltage.

As in FIG. 4B, the input stage 510 of FIG. 5 is active only when the clock is asserted (CLK is high and $\overline{\text{CLK}}$ is low), hence in an "evaluate and precharge" phase. However, in a "copy and hold" phase, transistors M13 (523) and M14 (524) are switched off. There is no bias current running through the input stage 510; none of the transistors M1-M14 (511-524) carries a current and therefore the input stage 510 is not active in this phase. The input signals do not impact the circuit state, and nodes 505 and 506 are not kept close to half the supply voltage. At the start of the "copy and hold" phase, nodes 505 and 506 have a small residual offset due to their parasitic capacitances and the result of the input signals comparison in the prior "evaluate and precharge" phase.

A method for fast comparison of two differential analog signals comprises: receiving a first differential input signal (e.g., IN1+ and IN1− at 501 and 502); receiving a second differential input signal (e.g., IN2+ and IN2− at 503 and 504); forwarding the first differential input signal to a first differential pair (e.g., M1-M2, 511-512, inside differential quad M1-M4, 511-514); forwarding the second differential input signal to a second differential pair (e.g., M5-M6, 515-516 inside differential quad M5-M8, 515-518); amplifying the first differential input signal and forwarding the amplified first differential input signal to a pair of summing elements (e.g., differential data rails 506 and 505); amplifying the second differential input signal and forwarding the amplified second differential input signal to the pair of summing elements; in the pair of summing elements, subtracting the amplified second differential input signal from the amplified first differential input signal; and limiting the excursion (e.g., by M9-M12, 519-522) of the differential data rails carrying the result of the subtraction.

Figure 6:
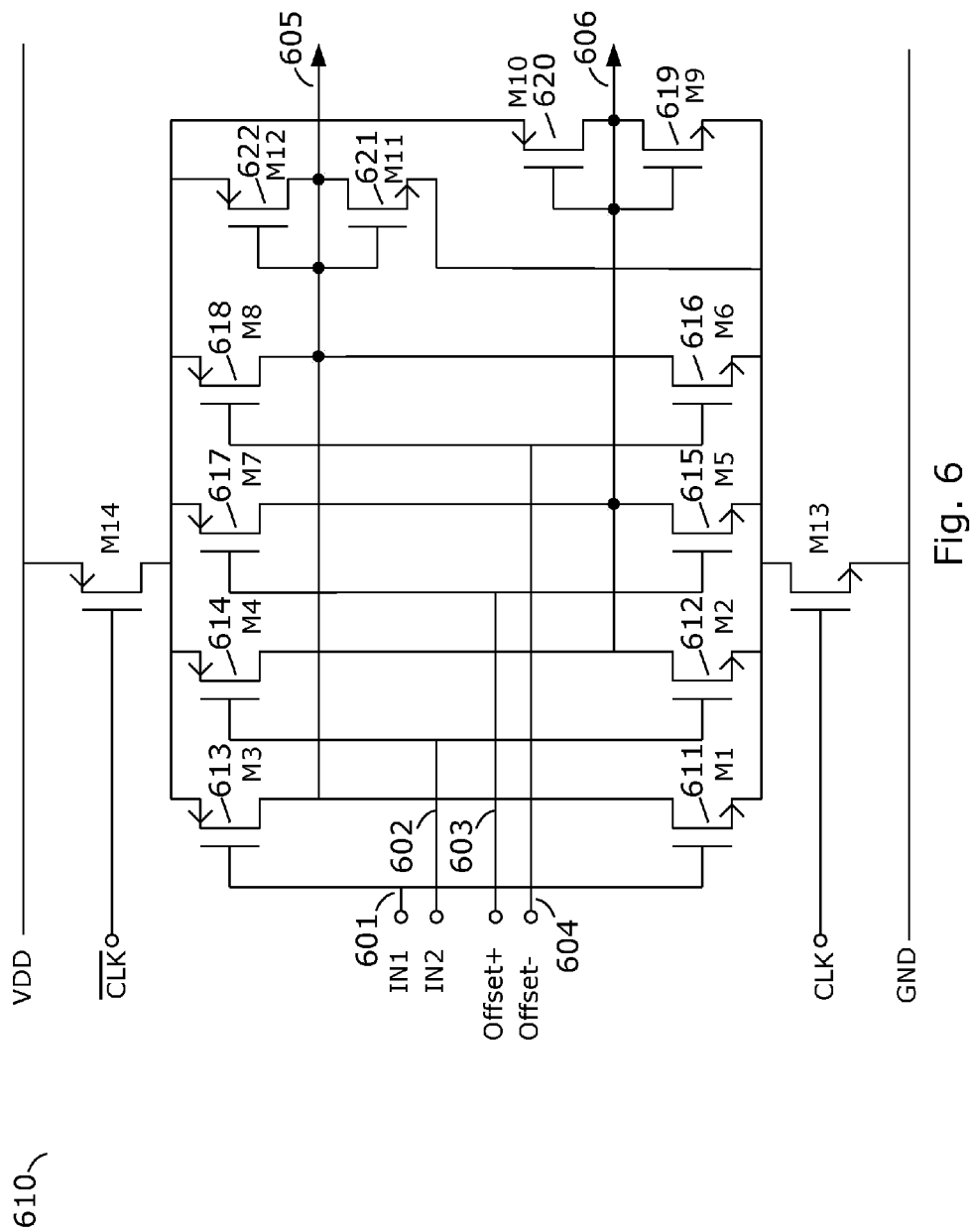
FIG. 6 illustrates a sense amplifier input stage with single-ended inputs and a differential offset control input according to an embodiment of the invention.

FIG. 6 illustrates a sense amplifier input stage 610 with single-ended inputs IN1 (601) and IN2 (602) and a differential offset control input 603-604 according to an embodiment of the invention. The sense amplifier input stage 610 is energized during an "evaluate and precharge" phase, at which time the first differential quad M1-M4 (611-614) compares the values of input signals on inputs IN1 (601) and IN2 (602). The result, in the form of a differential output current, is provided to data rails 605 and 606. The second differential quad M5-M8 (615-618) acts on the signal on differential offset control input 603-604. Again, the result, in the form of a differential output current, is provided to data rails 605 and 606 and subtracted from the result from the first differential quad M1-M4 (611-614). Transistors M9-M12 (619-622) limit the voltage excursion of data rails 605 and 606.

The first and the second differential quads may have unequal drive strengths, i.e. unequal transconductance and/or unequal output impedance. For instance, if the drive strength of the second differential quad M5-M8 (615-618) is smaller than the drive strength of the first differential quad M1-M4 (611-614), it is easier to compensate small offsets. Assuming that offsets at the inputs of the first differential M1-M4 (611-614) and the second differential quad M5-M8 (615-618) are of the same order of magnitude but not necessarily equal, then a 2 times smaller drive strength of the second differential quad M5-M8 (615-618) will make offset compensation about twice as sensitive. An 8 times smaller drive strength of the second differential quad M5-M8 (615-618) will make offset compensation about eight time as sensitive, etc.

A method for compensating input offset when comparing levels of two analog signals, according to an aspect of the invention comprises: receiving a first analog signal (e.g., signal IN1) on a first input node (e.g. 601) of a first differential pair of transistors (e.g., M1-M2, 611, 612), wherein the first differential pair has a first drive strength, and a second analog signal (e.g., signal IN2) on a second input node (e.g., 602) of the first differential pair; comparing the first analog signal and the second analog signal in the first differential pair; forwarding a differential result of the analog signal comparison to a pair of summing elements (e.g., differential data rails 606 and 605); receiving a differential control signal (e.g., Offset+ and Offset−) on two input nodes (e.g., 603 and 604) of a second differential amplifier (e.g., M5 and M6, 615 and 616), wherein the second differential pair has a second drive strength that is smaller than the first drive strength; comparing the differential control signal in the second differential pair; forwarding a differential result of the differential control signal comparison to the pair of summing elements; using a capacitance to store the comparison result; and limiting the excursion of the pair of summing elements.

Figure 7:
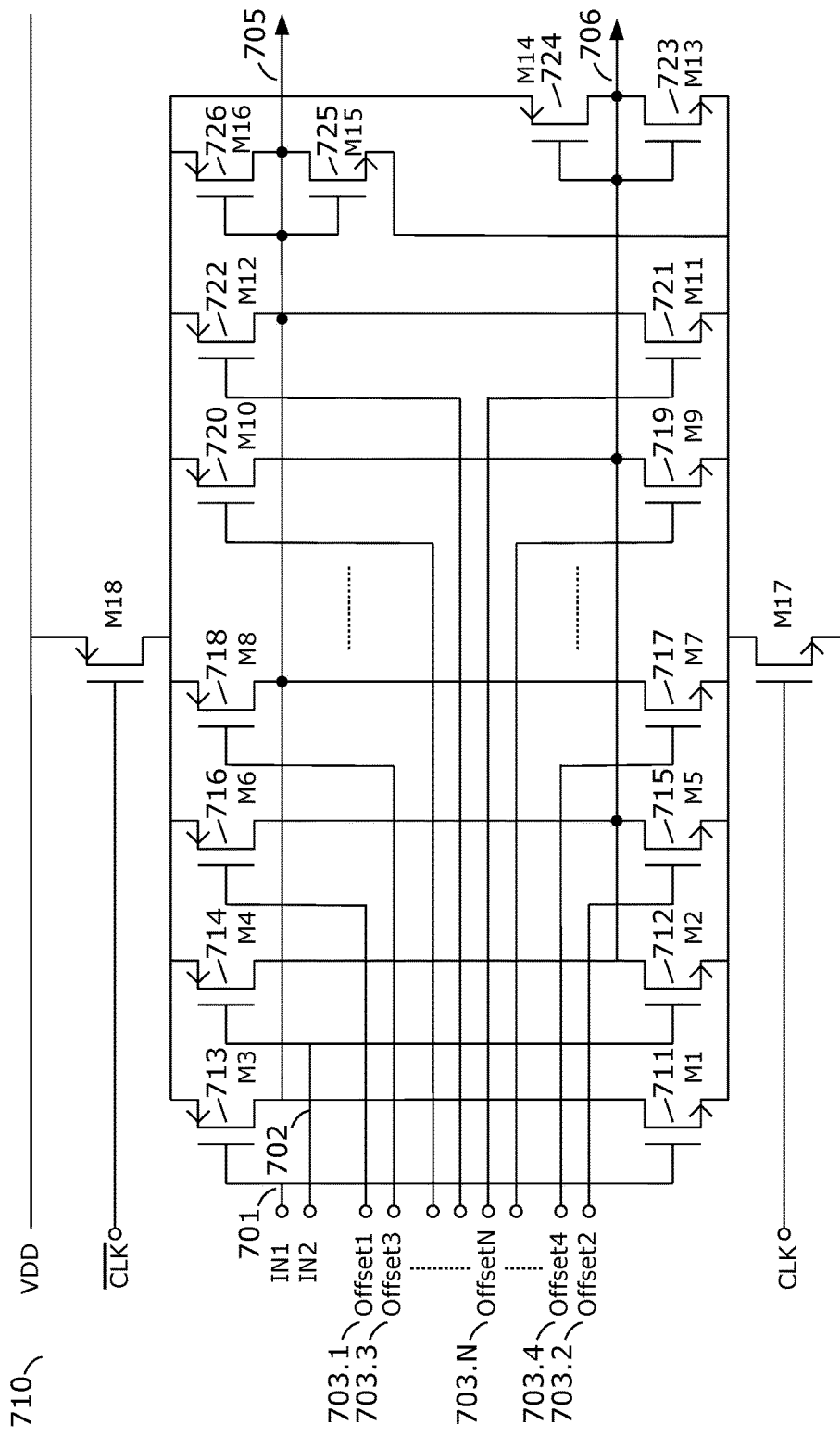
FIG. 7 illustrates a sense amplifier input stage with an offset control input bus according to an embodiment of the invention.

FIG. 7 illustrates a sense amplifier input stage 710 with an offset control input bus 703.1-703.N according to an embodiment of the invention. The sense amplifier input stage 710 has inputs IN1 (701) and IN2 (702). It is energized during an "evaluate and precharge" phase, at which time differential quad M1-M4 (711-714) compares the values of input signals on inputs IN1 (701) and IN2 (702). The result, in the form of a differential output current, is provided to data rails 705 and 706 (functioning as summing elements).

Differential quad M1-M4 (711-714) has a first drive strength. An array of N transistors, here shown as M5-M12 (715-722), controlled by a bus Offset1 . . . OffsetN (703.1-703.N) of offset control signals, is available to manage offset compensation. For instance, N-type transistor M5 (715) is available to reduce current in data rail 706, i.e. pull its voltage down, and P-type transistor M6 (716) is available to increase current in data rail 706, i.e. push its voltage up. M5 (715) and M6 (716) may have a second drive strength, which may be smaller than the first drive strength. N-type transistor M7 (717) is available to reduce current in data rail 705, i.e. pull its voltage down, and P-type transistor M8 (718) is available to increase current in data rail 705, i.e. push its voltage up. M7 (717) and M8 (718) may also have the second drive strength.

A next set of two or four transistors may have a third drive strength, which may be smaller than the second drive strength, etc. The final set of two or four transistors, here shown as M9-M12 (719-722), may have a final drive strength, which may be smaller than all previous drive strengths in the array. In general, N may be a multiple of 4, where each set of four inputs is related to four transistors (2 N-type and 2 P-type transistors). One set of four transistors may have one drive strength, and the next set may have a smaller drive strength.

Offset control signals Offset1 . . . OffsetN (703.1-703.N) are applied to the basis terminals of the N transistors in the array. Offset control signals of P-type transistors are active low, whereas offset control signals of N-type transistors are active high. The offset signals Offset1 . . . OffsetN (703.1-703.N) may be digital, analog, or a combination of both.

As shown in previous embodiments, transistors M13-M16 (723-726) are configured to limit the voltage excursion of data rails 705 and 706 during the "evaluate and precharge" phase.

Although the description has been described with respect to particular embodiments thereof, these particular embodiments are merely illustrative, and not restrictive. For instance, example embodiments show comparison of two analog input signals, where aspects of the invention are equally applicable when three or more analog input signals are compared. All variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A method for accurately comparing levels of two analog signals at a high-speed comprising:
   (a) during a first phase of a clock signal:
      (i) receiving the two analog signals;
      (ii) forwarding the two analog signals to a first differential pair;
      (iii) comparing the levels of the two analog signals in the first differential pair to obtain a differential comparison result as a differential signal;
      (iv) energizing and activating a first voltage excursion limiter;
      (v) forwarding at least a part of the differential comparison result to the first voltage excursion limiter;
      (vi) in the first voltage excursion limiter, reducing an effect of prior occurred positive feedback; and
      (vii) storing the at least a part of the differential comparison result on a first capacitance.

2. The method of claim 1, wherein the first differential pair is configured to provide differential output signals at a common mode voltage between one quarter and three quarters of a power supply voltage.

3. The method of claim 1, further comprising:
   (a) during the first phase of the clock signal:
      (viii) energizing the first differential pair;
   (b) during a second phase of the clock signal:
      (i) de-energizing the first differential pair;
      (ii) de-energizing the first voltage excursion limiter;
      (iii) forwarding the stored at least a part of the differential comparison result to an amplifier with positive feedback;
      (iv) in the amplifier with positive feedback, quickly amplifying the stored at least a part of the differential comparison result to obtain an asserted signal;
      (v) forwarding the asserted signal to a data storage element; and
      (vi) dependent on a type of the asserted signal, setting or resetting the data storage element to obtain a fast comparison output signal.

4. The method of claim 3, further comprising one of energizing and additionally energizing the amplifier with positive feedback during the second phase of the clock signal.

5. The method of claim 3, further comprising forwarding the asserted signal to a second capacitance during the second phase of the clock.

6. The method of claim 5, further comprising buffering the forwarded asserted signal on the second capacitance to obtain an accurate high-speed comparison output signal.

7. A sense amplifier, comprising:
   a first differential pair with two inputs and two outputs, wherein the first differential pair inputs are configured for receiving two analog input signals;
   a first voltage excursion limiter coupled with at least one of the two first differential pair outputs, wherein the first voltage excursion limiter is configured to limit a voltage on the at least one of the two first differential pair outputs to no less than a voltage on a common node of the first differential pair when the first voltage excursion limiter is energized; and
   a first set of one or more switches with each a reference terminal, an input terminal, and an output terminal, whose reference terminal(s) is/are coupled with one of a ground rail and a supply voltage rail and whose output terminal(s) is/are configured to energize the first differential pair and the first voltage excursion limiter during a first phase of a clock signal, and to de-energize the first differential pair and the first voltage excursion limiter during a second phase of the clock signal.

8. The sense amplifier of claim 7, wherein the two first differential pair outputs are configured to operate at a common mode voltage between one quarter and three quarters of a power supply voltage.

9. The sense amplifier of claim 7, further comprising:
   a first data rail coupled with the first voltage excursion limiter and with one of the two first differential pair outputs;

a second data rail coupled with an other of the two first differential pair outputs;

a first differential quad, comprising the first differential pair and a second differential pair, the first differential quad having two inputs and two differential outputs, the first differential quad inputs configured for receiving the two analog input signals, and its differential outputs coupled with the first and the second data rails;

a second voltage excursion limiter coupled with the second data rail; and a second set of one or more switches with each a reference terminal, an input terminal, and an output terminal, whose reference terminals is/are coupled with an other of the ground rail and the supply voltage rail and whose output terminal(s) is/are configured to energize the first differential quad and the first and second voltage excursion limiters during the first phase of the clock signal, and to de-energize the first differential quad and the first and second voltage excursion limiters during the second phase of the clock signal.

10. The sense amplifier of claim 9, further comprising:
an amplifier with positive feedback with two inputs and two outputs, wherein each amplifier with positive feedback input is coupled with one of the two data rails, and each amplifier with positive feedback output is coupled with one of the two data rails, the amplifier comprising at least a first transistor and a second transistor, wherein an output of the first transistor is coupled with an input of the second transistor and with the first data rail, and an output of the second transistor is coupled with an input of the first transistor and with the second data rail.

11. The sense amplifier of claim 10, wherein the first and the second transistor have a polarity of one of N-type and P-type, and further comprising:
a third and a fourth transistor, having a polarity of an other of N-type and P-type, wherein an input of the third transistor is coupled with the input of the first transistor and the second data rail, and an output of the third transistor is coupled with the output of the first transistor and the first data rail, and wherein an input of the fourth transistor is coupled with the input of the second transistor and the first data rail, and an output of the fourth transistor is coupled with the output of the second transistor and the second data rail.

12. The sense amplifier of claim 10, further comprising:
a fifth transistor, having an input coupled with the input of the first transistor, an output coupled with the output of the first transistor and a reference terminal coupled with a reference terminal of the first transistor via a third switch that is configured to be switched on during the second phase of the clock signal; and
a sixth transistor, having an input coupled with the input of the second transistor, an output coupled with the output of the second transistor and a reference terminal coupled with a reference terminal of the second transistor via a fourth switch that is configured to be switched on during the second phase of the clock signal.

13. A method for fast comparison of first and second differential analog input signals comprising:
receiving the first differential analog input signal;
receiving the second differential analog input signal;
forwarding the first differential analog input signal to a first differential quad;
forwarding the second differential analog input signal to a second differential quad;
in the first differential quad, amplifying the first differential analog input signal and forwarding the amplified first differential input signal to a pair of summing elements;
in the second differential quad, amplifying the second differential analog input signal and forwarding the amplified second differential analog input signal to the pair of summing elements;
in the pair of summing elements, subtracting the amplified second differential analog input signal from the amplified first differential analog input signal; and
limiting an excursion of the summing elements carrying a result of the subtraction to less than half a supply voltage.

14. The method of claim 13, wherein the pair of summing elements comprise a pair of data rails.

15. The method of claim 13, further comprising:
during a first phase of a clock signal, energizing the first and second differential quads and enabling the limiting the excursion; and
during a second phase of the clock signal, de-energizing the first and second differential quads and disabling the limiting the excursion.

16. The method of claim 15, further comprising:
during the second phase of the clock signal, quickly amplifying a signal present on the summing elements to obtain an asserted signal;
forwarding the asserted signal to a data storage element; and
dependent on a type of the asserted signal, setting or resetting the data storage element to obtain a fast comparison output signal.

17. A method for compensating input offset when comparing levels of two analog signals, comprising:
receiving a first analog signal on a first input of a first differential pair of transistors, and a second analog signal on a second input of the first differential pair, wherein the first differential pair has a first drive strength;
comparing the first analog signal and the second analog signal in the first differential pair;
forwarding a differential result of the analog signal comparison to a pair of summing elements;
receiving a differential control signal on two inputs of a second differential pair, wherein the second differential pair has a second drive strength that is smaller than the first drive strength;
comparing the differential control signal in the second differential pair;
forwarding a differential result of the differential control signal comparison to the pair of summing elements;
using a capacitance to store the comparison result; and
limiting an excursion of the pair of summing elements.

18. The method of claim 17, further comprising:
receiving one or more additional differential control signals on inputs of one or more additional differential pairs, with additional drive strengths smaller than the first drive strength.

* * * * *